United States Patent
Yanagisawa

(10) Patent No.: US 6,316,963 B1
(45) Date of Patent: Nov. 13, 2001

(54) CYCLE SELECTION CIRCUIT AND SEMICONDUCTOR MEMORY STORAGE USING THE SAME

(75) Inventor: Takeshi Yanagisawa, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/630,406

(22) Filed: Aug. 1, 2000

(30) Foreign Application Priority Data

Aug. 4, 1999 (JP) .................................................. 11-221201

(51) Int. Cl.[7] ...................... H03K 19/094; H03K 19/003
(52) U.S. Cl. ............................................... 326/113; 326/10
(58) Field of Search ................................... 326/113, 114, 326/112, 119, 121, 105, 106, 108, 10

(56) References Cited

U.S. PATENT DOCUMENTS 4,985,647 * 1/1991 Kawada ................................ 326/113
5,598,114 * 1/1997 Jamshidi ............................. 326/113
5,600,277 * 2/1997 Koelling ............................... 327/526

FOREIGN PATENT DOCUMENTS 5-189960    7/1993 (JP).
406021778A  * 1/1994 (JP).
11-31383    2/1999 (JP).

* cited by examiner

Primary Examiner—Michael Tokar
Assistant Examiner—James H Cho
(74) Attorney, Agent, or Firm—Sughrue, Mion, Zinn, Macpeak & Seas, PLLC

(57) ABSTRACT

The cycle selection circuit according to the present invention has a transfer gate circuit provided with a transfer gate which let an input signal pass through, and a transfer gate which let a standard signal having a standard cycle value pass through, a transfer gate selection circuit which selects one transfer gate from among the transfer gates provided in the transfer gate circuit and outputs the signal that passes through the selected transfer gate as a selected signal, and a forced control signal generating circuit provided in the transfer gate circuit which forcibly selects the transfer gate that let the standard signal pass through and designates the standard signal as a selected signal.

12 Claims, 4 Drawing Sheets

CYCLE SELECTION CIRCUIT AND SEMICONDUCTOR MEMORY STORAGE USING THE SAME

BACKGROUND OF THE INVENTION

1. Field of the Invention

The present invention relates to a cycle selection circuit, and more particularly to a cycle selection circuit which is capable of changing the cycle of a refresh timer.

2. Description of the Prior Art

Because of the nature of a DRAM being a volatile memory, it has been indispensable that it is adapted to a refresh operation in order to hold the electrical charges on the memory cells.

One type of refresh operation is the self-refresh operation by which refresh operation is conducted by automatically incrementing an internal refresh counter within a refresh cycle time as a result of holding a refresh control terminal provided in the DRAM at a certain prescribed level.

An example of the conventional technique concerning the self-refresh operation has been disclosed as a semiconductor memory storage in Japanese Patent Applications Laid Open, No. Hei 5-1899600.

The semiconductor memory storage disclosed in the document is given a congfiguration in which a fuse that makes the self-refresh cycle adjustable and a switch means that is connected in series with the fuse are provided.

With such a configuration, it is possible to realize the same state as that in which the fuse is disconnected by bringing the switch means to the off-state through application of a prescribed voltage to a control terminal of the switch means, and reinstate the state in which the fuse is not disconnected by returning the switch means to the on-state.

In addition to the above, a synchronous DRAM (SDRAM) which performs a synchronous operation according to a prescribed clock signal has been developed recently by using a DRAM as a basic constituent element.

An example of the conventional technique concerning the SDRAM has been disclosed as a semiconductor memory storage in Japanese Patent Application Laid Open, No. Hei 11-31383.

According to the semiconductor memory storage disclosed in the document, an SDRAM provided with a self-refresh mode and a refresh control circuit, is given a configuration in which the SDRAM is equipped with a refresh cycle control signal input terminal for selectively switching the refresh cycle from the outside in order to switch the refresh cycle in response to the operating frequency.

With such a configuration, the optimum use of an SDRAM at the operating frequency can be realized by selectively switching the refresh cycle in the self-refresh mode of the SDRAM in response to its operating frequency. As a result, reduction in the power consumption and the busy rate of a memory system containing an SDRAM or the like can be achieved.

Besides, the specification of a DRAM is classified according to the charge holding time (tREF) of the memory cells within the chip, and a preliminary wafer test for measuring the tREF to determine the specification is conducted in the assembly step of the semiconductor memory storage.

The preliminary wafer test is carried out by giving a signal having a self-refresh timer cycle to the memory cells within the chip while varying the cycle.

As a result, when cell data can be retained, for example, even when the cycle of the self-refresh timer is increased, namely, when the tREF is made larger than a prescribed limit, it is regarded to have the specification for low current consumption products (low power products), and the X16 I/O products (multi-bit I/O products) among these are served for use in portable equipment.

On the other hand, when the cell data cannot be retained, namely, when the tREF is less than a prescribed value it is regarded to have the specification for normal power products, and the X4 and X8 I/O products among these are served for the use in the power machines.

Moreover, when a defective memory cell is discovered in the preliminary wafer test, the product is saved by means of the redundancy procedure.

By conducting a preliminary wafer test for measuring the REF in this manner, DRAMs are utilized for assembly according to the classification of their specifications.

However, in the conventional semiconductor memory storage disclosed in Japanese Patent Applications Laid Open, No. Hei 5-189960, use of a switch means connected in series with the fuse is presumed in changing the timer cycle.

As a result, it is not possible in this method, after the disconnection of the fuse, to restore the same state as that wherein the fuse is not disconnected, although it is possible prior to the disconnection of the fuse, to realize the same state as that wherein the fuse is disconnected.

Accordingly, even if the memory cell is saved by means of the redundancy technique, after the fuse is disconnected, it is not possible to conduct a preliminary wafer test for the redundancy cell, so that the product is sometimes decided unfit for the use as a low current consumption product and regarded as a defective item.

Furthermore, the feature of the conventional semiconductor memory storage as disclosed in Japanese Patent Applications Laid Open, No. Hei 11-31383 is that the refresh cycle is selectively switched in response to the operating frequency. In this device, it is assumed that the refresh cycle corresponding to the operating frequency is fixed, and a specific power supply voltage level for generating signals with the operating frequency is supplied.

In reality, however, it will not happen in a general purpose product such as an SDRAM that the refresh cycle is variable corresponding to the operating frequency.

Moreover, the above invention assumes that a refresh cycle control signal input terminal for selectively switching the refresh cycle from, the outside is provided. However, in a device demanded to be small-sized, it is not desirable from structural or productivity viewpoint to newly provide an external terminal.

Consequently, the change of the refresh cycle is preferable to be executed with solely the production of low current consumption product in mind rather than according to the operating frequency.

Moreover, the DRAM is saved by means of the redundancy technique when defect in the memory cell is discovered by the preliminary wafer test for cell check.

However, for a device that does not have a check function for the saved redundancy cell, it becomes sometimes clear, depending upon the cell that is saved, that the device cannot retain data. In such a case, the device is handled as a defective product.

Furthermore, even if a chip decided to be inappropriate for a certain specification is confirmed to be suitable for another specification after the fuse for adjusting the refresh timer cycle is disconnected, there has not been available a means for saving the chip. Accordingly, if such a saving means can be found, then the number of defective products can be reduced and flexible handling of a variety of specifications will become feasible.

BRIEF SUMMARY OF THE INVENTION

OBJECTS OF THE INVENTION

It is the object of the present invention to provide, in a circuit which permits to adjust the timer cycle for self-refresh by means of fuse disconnection or the like, a cycle selection circuit which makes it possible to restore the timer cycle after the adjustment to a standard value, and a semiconductor memory storage using the cycle selection circuit.

SUMMARY OF THE INVENTION

The cycle selection circuit according to the present invention is provided with a transfer gate circuit consisting of a transfer gate which let an input signal pass through and another transfer gate which let a standard signal with a standard cycle pass through, a transfer gate selection circuit which selects one of the transfer gates provided in the transfer gate circuit and designate the signal that passes through the selected transfer gate as a selected signal, and a forced control signal generation means which forcibly selects the transfer gate provided in the transfer gate circuit that let the standard signal and designates the standard signal as a selected signal, and outputs either one of the selected signals.

Moreover, the cycle selection circuit according to this invention is provided with a primary transfer gate circuit equipped with a plurality of transfer gates that let individual input signals pass through respectively, a transfer gate selection circuit which selects one of the transfer gates provided in the primary transfer gate circuit, and designates the signal that passes through the selected transfer gate as a primary selected signal, a secondary transfer gate circuit provided with a transfer gate that let the primary selected signal output from the primary transfer gate circuit pass through and a transfer gate which let a standard signal with a cycle of a standard value pass through, and a forced control signal generation means provided in the secondary transfer gate circuit and forcibly selects a transfer gate which let a default signal pass through, and designates the standard signal as a selected signal, and outputs either of the primary selected signal or the selected signal.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
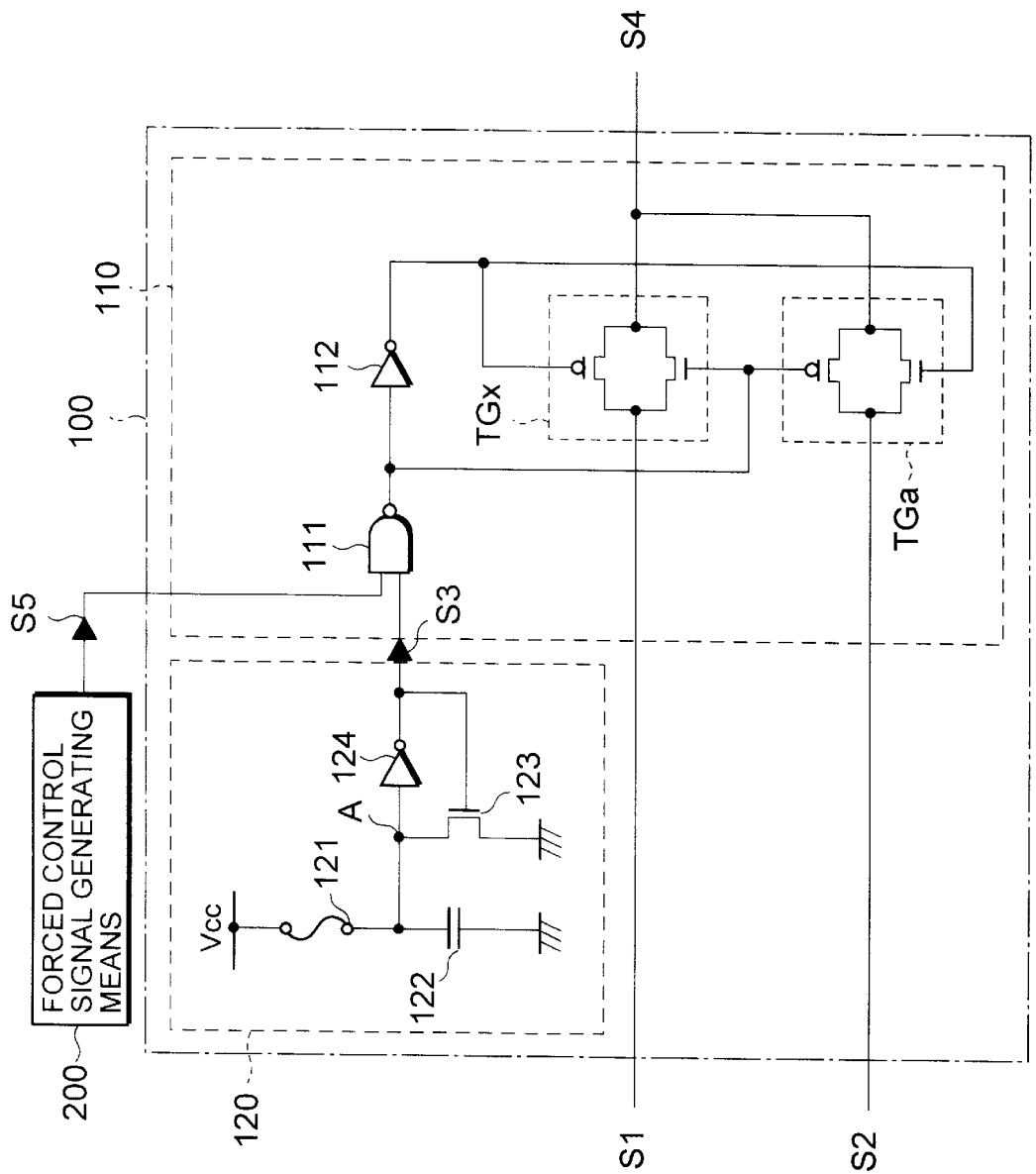
FIG. 1 is a block diagram showing the configuration of a first embodiment of this invention.

Referring to FIG. 1, a first embodiment of the cycle selection circuit according to this invention will be described.

As shown in the figure, a cycle selection circuit 100 is provided with a transfer gate circuit 110 and a transfer gate selection circuit 120.

In this embodiment, a standard signal S1 is a signal corresponding to a self-refresh timer cycle employed for a normal power product, and an input signal S2 is a signal corresponding to the self-refresh timer cycle, longer than that of S1, employed for a low power product. The transfer gate circuit 110 is provided with a transfer gate TGx which let the standard signal pass through, a transfer gate TGa which let the input signal S2 pass through, a NAND circuit 111, and an inverter 112.

The transfer gate selection circuit 120 is provided with a fuse 121 which determines a refresh signal, a capacitor 122 which maintains the output level of the transfer gate selection circuit 120, an N-MOS transistor 123 which maintains the output level at disconnection of the fuse 121, and an inverter 124 which outputs an output signal S3 of the selection circuit.

Moreover, the cycle selection circuit 100 is connected to a forced control signal generating means 200 which generates a forced control signal S5 for making the output signal S4 output from the cycle selection circuit 100 possess the same cycle as the standard signal S1.

Here, the transfer gates TGx and Tga are each formed by combining an N-MOS transistor and a P-MOS transistor in parallel, and are also called a transmission gate and an analog switch, respectively.

Besides, the forced control signal generating means 200 may be provided with a bonding option circuit, although not shown explicitly in the figure.

The bonding option circuit is a circuit for bonding a pad that determines the specification of the GND and Vcc of the chip in the assembly step in order to deal with diversified specifications of the DRAM.

By providing the bonding option circuit in the forced control signal generating means 200, it is possible to change the timer cycle by outputting the forced control signal S5 accompanying the change in the bonding method even after the disconnection of the fuse.

Besides, the forced control signal generating means 200 may be provided with a forced signal generating fuse which generates the forced control signal S5, though not shown in the figure.

The disconnection of the forced signal generating fuse may be executed by controlling laser beams for its disconnection in the assembly step or the inspection step after the disconnection of the fuse 121 in the transfer gate selection circuit 120 when a change in the timer cycle becomes necessary.

The forced control signal S5 output from the forced control signal generating means 200 provided with the forced signal generating fuse is normally at an "H" level, and goes to an "L" level after the disconnection of the forced signal generating fuse.

When a forced control signal S5 at "L" level is output, the transfer gate TGx through which the standard signal S1 passes is selected in the transfer gate circuit 110, and the output signal S4 of the cycle selection circuit 100 is given the same cycle as that of the standard signal S1.

By providing the forced control signal generating means 200 with the forced signal generating fuse, it is possible to change the timer cycle even after the disconnection of the fuse 121 in the transfer gate selection circuit 120, as described in the above.

Next, referring to FIG. 1, the operation of this embodiment will be described.

When the fuse 121 in the transfer gate selection circuit 120 is not disconnected, a node A being the source node of the N-MOS transistor goes to "H" level since it is connected to Vcc. Accordingly, the output signal S3 of the selection circuit goes to "L" level by being inverted by the inverter 124.

In this case, the potential value at the node A is ensured so that no problem will be caused even without particularly latching the potential value.

On the other hand, when the fuse 121 is disconnected, the node A goes to "L" level since it is floating, and its potential value cannot be ensured.

In this case, at the time of making a power supply, the potential of the node A is pulled toward the value of GND, and if the potential value is not held at this time, there is a possibility of causing a malfunction under the effect of operational noise of one kind or another. For this reason, the N-MOS transistor 123 ensures the potential level of the node A when the use 121 is disconnected to avoid the possibility just mentioned.

In this way, the output signal S3 of the selection circuit goes to "H" level when the fuse 121 is disconnected.

Next, the internal operation of the cycle selection circuit 100 will be described.

First, a standard signal S1 with the cycle of the standard value is input to the transfer gate TGx of the transfer gate circuit 110. In addition, an input signal S2 with a certain cycle is input to the transfer gate TGa.

The forced control signal S5 output from the forced control signal generating means 200 is normally at "H" level.

Here, when the fuse 121 in the transfer gate selection circuit 120 is not disconnected, a selection circuit output signal S3 at "L" level is output from the transfer gate selection circuit 120. The selection circuit output signal S3 is received in the transfer gate circuit 110 by the transfer gates TGx and TGa via the NAND circuit 111 and the inverter 112. In this way, TGx is selected out of the transfer gates TGx and Tga.

On the other hand, when the fuse 121 is disconnected, the transfer gate selection circuit 120 outputs a selection circuit output signal S3 at "H" level, and TGa out of the transfer gates TGx and TGa is selected in the transfer gate circuit 110.

The cycle of the output signal S4 of the cycle selection circuit 100 has the same cycle as that of the standard signal S1 when the transfer gate TGx is selected, and has the same cycle as that of the input signal S2 when the transfer gate TGa is selected.

When a forced control signal S5 at "L" level is output later from the forced control signal generating means 200, the transfer gate TGx is selected regardless of whether or not the fuse 121 is disconnected, and the cycle of the output signal S4 has the same cycle as that of the standard signal S1.

In this manner, the timer cycle can be selected by the disconnection of the fuse for change of the timer cycle.

By giving a constitution which includes the forced control signal generating means 200 to the cycle selection circuit 100, the timer cycle can be restored to the standard value accompanying a change in the bonding method in the assembly step even after the disconnection of the fuse. Accordingly, the tREF can be reduced and the device can be saved as a normal power product.

Next, referring to FIG. 2, a second embodiment of the cycle selection circuit according to this invention will be described.

Figure 2:
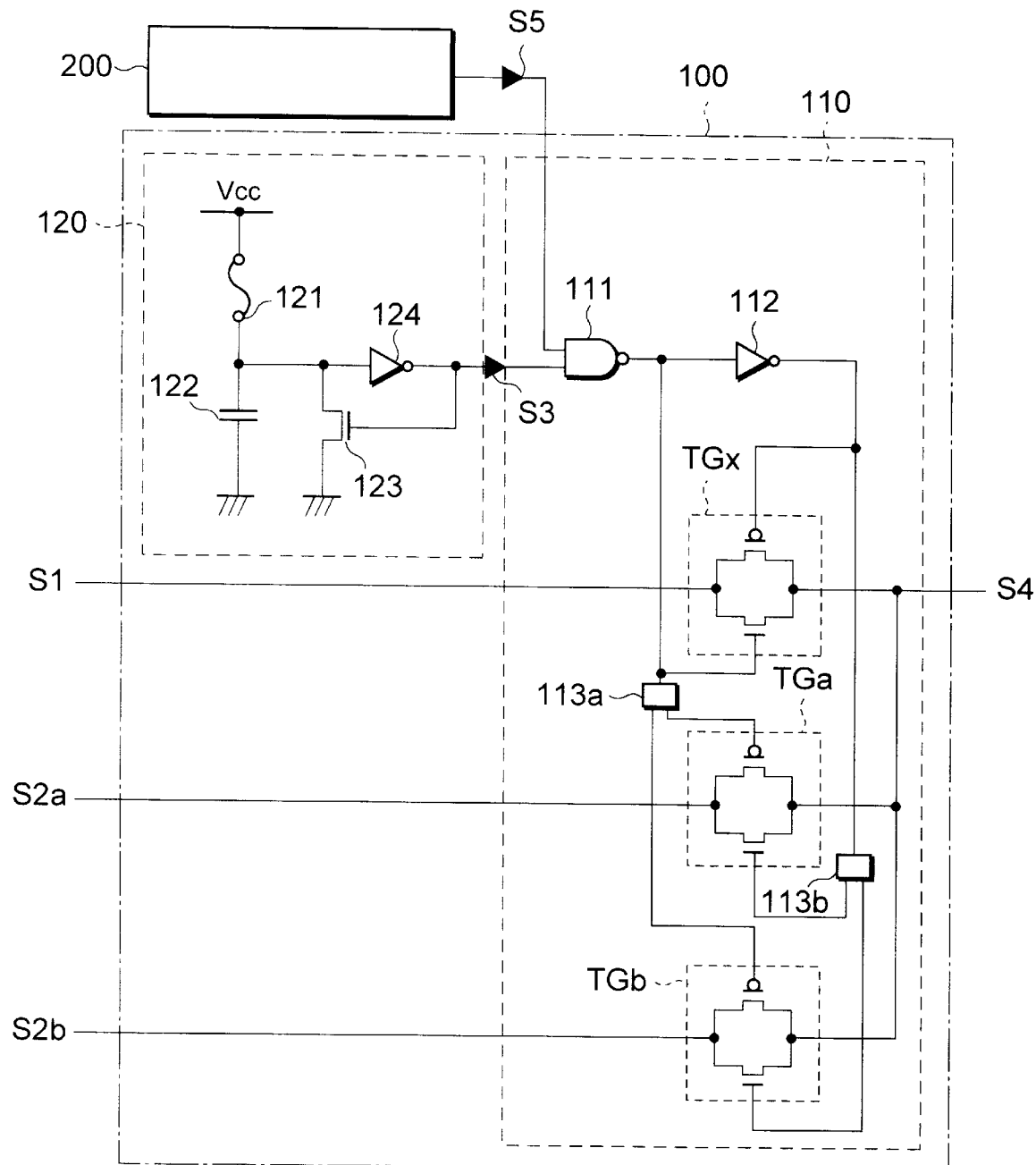
FIG. 2 is a block diagram showing the configuration of a second embodiment of this invention.

FIG. 2 is a block diagram showing the configuration of the second embodiment of the cycle selection circuit.

In the figure, the constituent components the same as those in FIG. 1 are given the same symbols to omit detailed description about them.

As shown in FIG. 2, the cycle selection circuit 100 is provided with the transfer gate circuit 110 and the transfer gate selection circuit 120.

The transfer gate circuit 110 is provided with the transfer gate TGx, two or more transfer gates TG (TGa and TGb) which let two or more input signals (S2a and S2b) pass through them individually, the NAND circuit 111, the inverter 112, and input signal switching means 113a and 113b which select one out of two or more input signals (S2a and S2b).

In addition, the cycle selection circuit 100 is connected to the forced control signal generating means 200 which outputs the forced control signal S5 for selecting the transfer gate TGx that let the standard signal S1 pass through it.

In FIG. 2 the case of having two transfer gates TG (TGa and TGb) is illustrated, but the invention is not limited to the case of two gates. However, for convenience of description the case of two transfer gates TG is employed here.

The input signal switching means 113a and 113b are means for selecting either one of the transfer gates TGa and TGb when a transfer gate other than TGx is selected.

The selection is conducted by the input signal switching means 113a and 113b linked with the self-refresh circuit or the like that carries out the refresh operation in the preliminary wafer test, and sequentially selects high cycle signals that are input to the cycle selection circuit 100.

When the transfer gate TGx is selected by the transfer gate selection circuit 120 or the forced control signal generating means 200, the same signal is transmitted to the transfer gates TGa and TGb so as to inhibit the selection of both of the transfer gates TGa and TGb.

Next, referring to FIG. 2, the operation of this embodiment will be described.

First, the forced control signal S5 output from the forced control signal generating means 200 is normally at "H" level.

When the fuse 121 in the transfer gate selection circuit 120 is not disconnected, a selection circuit output signal S3 at "L" level is output from the transfer gate selection circuit 120. The selection circuit output signal S3 is transmitted to the transfer gate TGx and the input signal switching means 113a and 113b via the NAND circuit 111 and the inverter 112.

In this case, the transfer gate TGx is selected since the selection circuit output signal S3 is at "L" level. That is, the cycle of the output signal S4 is the same as the cycle of the standard signal S1.

In the meantime, the input signal switching means 113a and 113b receiving the selection circuit output signal S3 send the same signal to both of the transfer gates TGa and TGb. By so doing, both of the transfer gates TGa and TGb will not be selected.

When the fuse 121 in the transfer gate selection circuit 120 is disconnected, the selection circuit output signal S3 goes to "H" level. Consequently, the input signal switching means 113a and 113b that receive the selection circuit output signal S3 select the transfer gates TGa and TGb that had been selected at the time when the fuse 121 was disconnected. From this fact, the cycle of the output signal S4 becomes the same as the of the input signal S2a or S2b that passes through the selected transfer gate TG out of the transfer gates TGa or TGb.

It is to be noted that the transfer gate TGx will not be selected in this case.

Moreover, when a forced control signal S5 at "L" level is output from the forced control signal generating means 200, the transfer gate TGx is selected. Accordingly, the input signal switching means 113a and 113b transmit the same signal to the transfer gates TGa and TGb to inhibit the selection of these transfer gates TGa and TGb.

The cycle of the output signal S4 at this time is the same as the cycle of the standard signal S1.

In this way, by adopting a configuration where a plurality of transfer gates TG are provided, it is possible to select a signal from among a plurality of input signals, and restore the timer cycle after the disconnection of the fuse to the standard value.

Next, referring to FIG. 3, a third embodiment of the cycle selection circuit according to this invention will be described.

Figure 3:
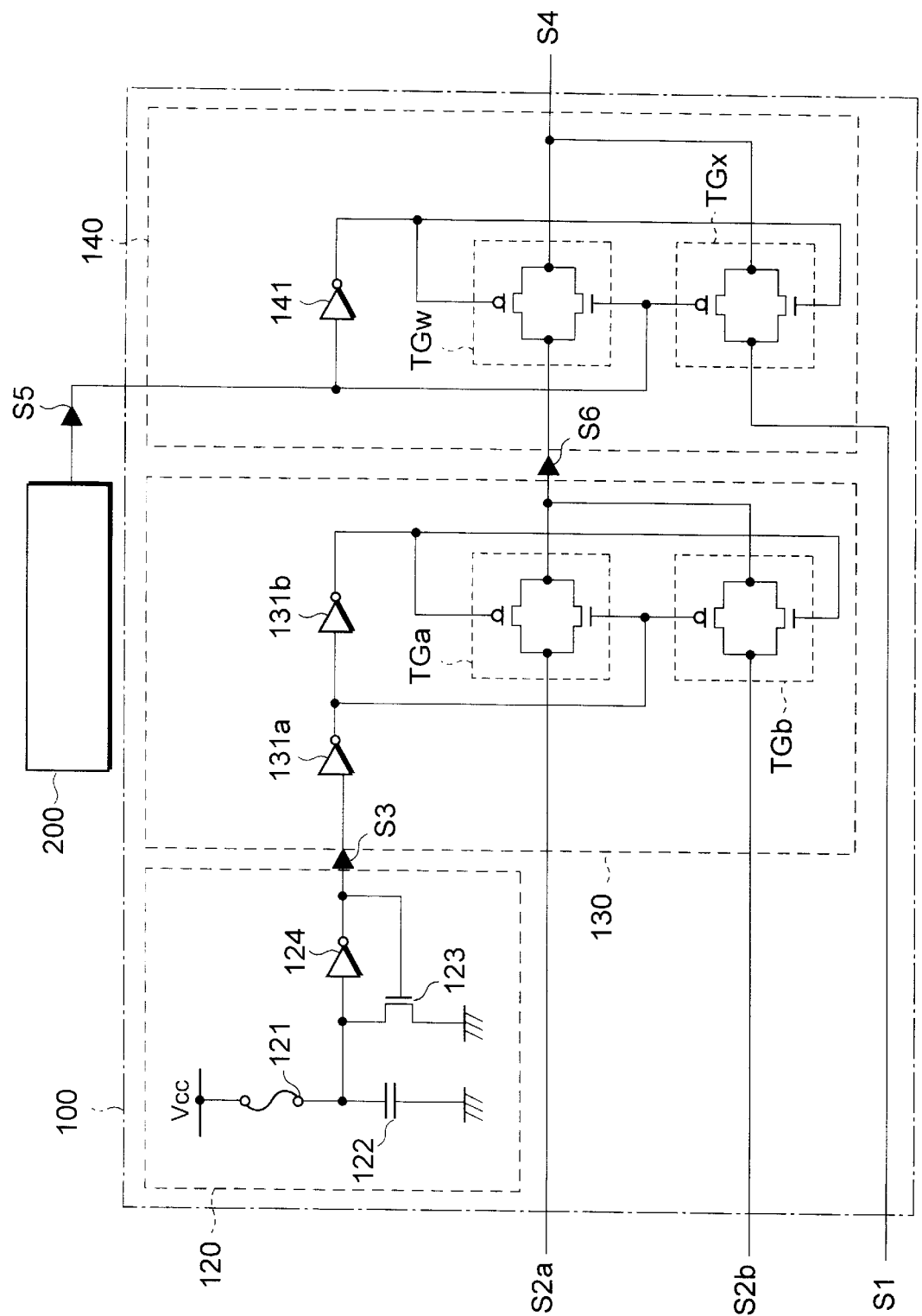
FIG. 3 is a block diagram showing the configuration of a third embodiment of this invention.

FIG. 3 is a block diagram showing the configuration of the third embodiment of the cycle selection circuit.

In the figure, the constituent components identical to those in FIGS. 1 and 2 will be given identical symbols to omit detailed description about them.

As shown in FIG. 3, the cycle selection circuit 100 is provided with the transfer gate selection circuit 120, a primary transfer gate circuit 130, and a secondary transfer gate circuit 140.

Here, the primary transfer gate circuit 130 is provided with the transfer gate TGa which let the input signal S1 pass through, the transfer gate TGb which let the input signal S2 pass through, an inverter 131a which controls the selection circuit output signal S3 output from the transfer gate selection circuit 120, and an inverter 131b which inverts the output of the inverter 131a and transmits the result to respective transfer gates TGa and TGb.

Moreover, in FIG. 3, the number of input signals to the primary transfer gate 130 is described to be two (S2a and S2b), but it is not limited to two. When there are three or more input signals, a circuit configuration may be realized in the manner similar to the transfer gate circuit 110 in FIG. 2.

Moreover, the secondary transfer gate circuit 140 is provided with a transfer gate TGw which let a primary output signal S6 output from the primary transfer gate circuit 130, and the transfer gate TGx which let the standard signal S1 pass through.

Moreover, the cycle selection circuit 100 is connected to the forced control signal generating means 200 which generates the forced control signal S5 that makes the cycle of the output signal S4 of the cycle selection circuit 100 to be equal to the cycle of the standard signal S2. Because of this, the secondary transfer gaze circuit 140 is provided with an inverter 141 for controlling the forced control signal S5 output from the forced control signal generating means 200.

Furthermore, the forced control signal generating means 200 may be provided with a bonding option circuit or a fuse which generates the forced control signal.

Next, referring to FIG. 3, the operation of this embodiment will be described.

First, when the fuse 121 in the transfer gate selection circuit 120 is not disconnected, a selection circuit output signal S3 at "L" level is output.

The selection circuit output signal S3 is input to the primary transfer gaze circuit 130, and is transmitted to the transfer gates TGa and TGb via the inverters 131a and 131b. Here, the transfer gate TGa is selected since the selection circuit output signal S3 is at "L" level. Accordingly, the cycle of the primary output signal S6 output from the primary transfer gate circuit 130 has the same cycle as that of the input signal S2 that passes through the transfer gate TGa.

On the other hand, when the fuse 121 in the transfer gate selection circuit 120 is disconnected, the selection circuit output signal S3 goes to "H" level. Consequently, in the primary transfer gate circuit 130, the transfer gate TGb is selected, and the cycle of the primary output signal S6 becomes equal to the cycle of the input signal S2 that passes through the transfer gate TGb.

In the secondary transfer gate circuit 140, the primary output signal S6 output from the primary transfer gate circuit 130 is input to the transfer gate TGw, and the standard signal S1 is input to the transfer gate TGx.

Here, the forced control signal S5 output from the forced control signal generating means 200 is normally at "H" level, and is transmitted to the transfer gates TGw and TGx via the inverter 141.

By receiving the transmitted forced control signal S5 at "H" level, TGw out of the transfer gates TGw and TGx is selected, and the cycle of the output signal S4 of the cycle selection circuit 100 goes to the cycle equal to that of the primary output signal S6.

When a forced control signal S5 at "L" level is output later from the forced control signal generation means 200, the transfer gate TGx is selected, and the cycle of the output signal S4 becomes the same as the cycle of the standard signal S1.

As in the above, by configuring the transfer gate TG to be composed of the primary and secondary components, it is possible to select a plurality of input signals by means of the transfer gate selection circuit, and to restore the timer cycle after the disconnection of the fuse to the cycle of the standard value.

Figure 4:
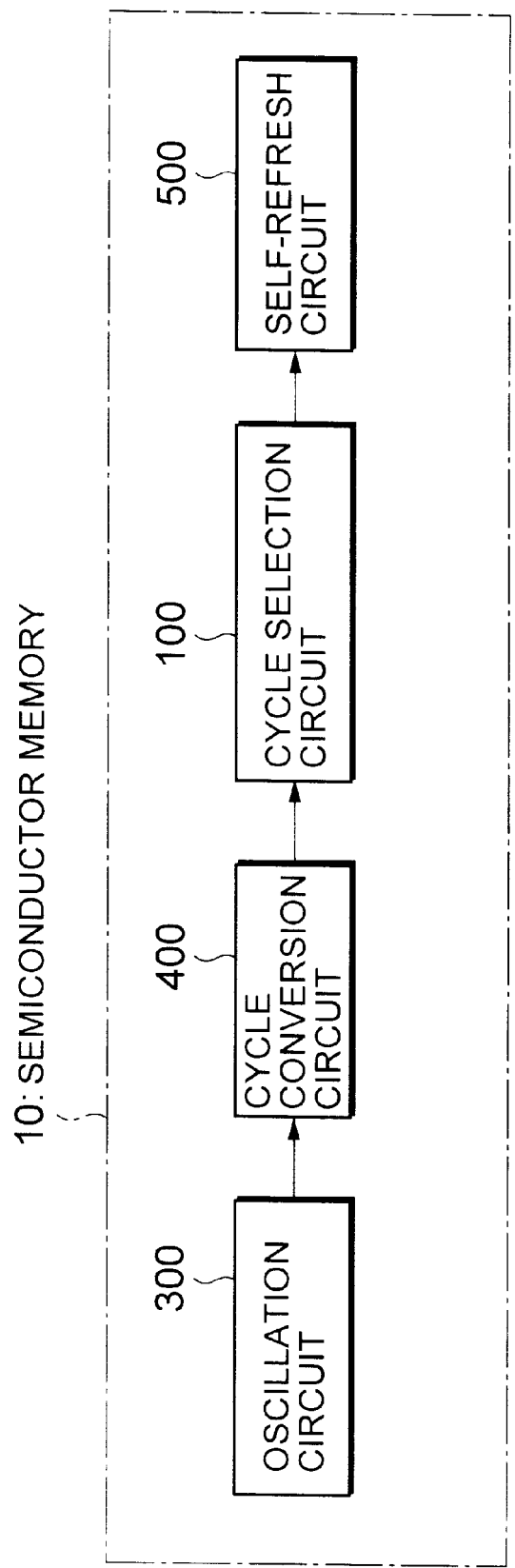
FIG. 4 is a block diagram showing the configuration of a semiconductor memory storage employing the cycle selection circuit according to this invention.

Next, referring to FIG. 4, which shows the configuration of a semiconductor memory storage using the cycle selection circuit according to this invention will be described.

As shown in the figure, a semiconductor memory storage 10 is constituted of an oscillation circuit 300 which outputs a basic signal of a prescribed cycle, a cycle conversion circuit 400 which outputs a high cycle signal with a cycle which is an integral multiple of the cycle of the basic signal by receiving the basic signal output from the oscillation circuit 300, a cycle selection circuit 100 which inputs the high cycle signal output from the cycle conversion circuit 400, and a self-refresh circuit 500 which executes self-refresh by inputting the selected signal output from the cycle selection circuit 100.

Here, the cycle selection circuit 100 is either one of the cycle selection circuits 100 described in the first to third embodiments.

Moreover, the cycle selection circuit 100 inputs an input signal being a high cycle signal output from the cycle conversion circuit 400, and a standard signal having a standard value of the cycle, selects one out of the input signal and the standard signal, and outputs an output signal being a selected signal to the self-refresh circuit 500.

Here, the number of the high cycle signal input to the cycle selection circuit 100 may be one, or two or more.

As described in the above, by providing a cycle selection circuit 100 to the semiconductor memory storage 10 which requires refresh operation, it is possible to restore the timer cycle to the standard value even after the fuse 121 for the timer cycle conversion in the cycle selection circuit 100 is disconnected, by inputting a signal through the bonding option circuit or the like.

In other words, a semiconductor memory storage regarded as a defective product by the preliminary wafer test, can be saved as a normal power product by restoring the timer cycle of the device to the standard cycle value.

In the embodiments of this invention described in the above, the cycle of the standard signal S1 is assumed to be smaller than that of the input signals S2 or the like, namely, the signal S1 is assumed to be a signal for a normal power product. However, when the low power products are increased in number due, for example, to the improvement in the manufacturing processes, a signal for a low power product with larger cycle than that of the input signal S2 may be adopted, on the contrary, as the standard signal S1.

As described in detail in the above, according to the cycle selection circuit of this invention, in a circuit whose timer cycle for self-refresh is adjustable by means of, for example, disconnection of the fuse, the timer cycle after adjustment can be restored to the standard value by the use of a signal output from a bonding option circuit or the like.

Moreover, according to a semiconductor memory storage using the cycle selection circuit of this invention, by restoring the timer cycle to the standard value using the cycle selection circuit, after the disconnection of the fuse for timer cycle conversion, it is possible to save a device, decided Lo be defective and unsuited for a low power product in the preliminary wafer test, as a normal power product.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A cycle selection circuit comprising, a transfer gate circuit provided with a transfer gate which let an input signal pass through and a transfer gate which let a standard signal having a cycle of a standard value pass through, a transfer gate selection circuit which selects one of the transfer gates provided in said transfer gate circuit and outputs the signal that passes through the selected transfer gate as a selected signal, and a forced control signal generating means provided in said transfer gate circuit, which forcibly selects the transfer gate that let said standard signal pass through and designates said standard signal as a selected signal.

2. The cycle selection circuit as claimed in claim 1, wherein said transfer gate circuit is provided with a plurality of transfer gates which let separate input signals pass through individually, and a transfer gate which let the standard signal having the cycle of a standard value.

3. The cycle selection circuit as claimed in claim 1, wherein said forced control signal generating means is provided with a bonding option circuit.

4. The cycle selection circuit as claimed in claim 1, wherein said forced control signal generating circuit is provided with a fuse.

5. The cycle selection circuit as claimed in claim 1, wherein said standard signal has a cycle smaller than that of said input signal.

6. The cycle selection circuit as claimed in claim 1, wherein said standard signal has a cycle larger than that of said input signal.

7. A cycle selection circuit comprising, a primary transfer gate circuit provided with a plurality of transfer gates which let separate input signals pass through individually, a transfer gate selection circuit which selects one of the transfer gates provided in said primary transfer gate circuit and designates the signal that passes through the selected transfer gate as a primary selected signal, a secondary transfer gate circuit which is provided with a transfer gate that let the primary selected signal output from said primary transfer gate circuit and a transfer gate that let a standard signal having a standard cycle value, and a forced control signal generating circuit provided in said secondary transfer gate circuit, which forcibly selects the transfer gate that let said standard signal pass through and designates said standard signal as a selected signal.

8. The cycle selection circuit as claimed in claim 7, wherein said forced control signal generating means is provided with a boding option circuit.

9. The cycle selection circuit as claimed in claim 7, wherein said forced control signal generating means is provided with a fuse.

10. The cycle selection circuit as claimed in claim 7, wherein said standard signal has a cycle smaller than that of said input signal.

11. The cycle selection circuit as claimed in claim 7, wherein said standard signal has a cycle larger than that of said input signal.

12. A semiconductor memory storage comprising, a primary transfer gate circuit provided with a plurality of transfer gates that let separate input signals pass through individually, a transfer gate selection circuit which selects one of the transfer gates provided in said primary transfer gate circuit and designates the signal that passes through the selected transfer gate as a primary selected signal, a secondary transfer gate circuit provided with a transfer gate that let the primary selected signal output from said primary transfer gate circuit pass through and a transfer gate that let a standard signal having a standard cycle value pass through, a cycle selection circuit provided in said secondary transfer gate circuit, which is configured by including a forced control signal generating means that forcibly selects the transfer gate that let said standard signal pass through and designates said standard signal as a selected signal, an oscillation circuit which outputs a basic signal with a prescribed cycle, a cycle conversion circuit which converts the basic signal output from said oscillation circuit into a high cycle signal having a cycle which is an integral multiple of the cycle of said basic signal and outputs the result to said cycle selection circuit, and a self-refresh circuit which conducts self-refresh operation by inputting the selected signal output from said cycle selection circuit.

* * * * *